United States Patent
Cheung et al.

(10) Patent No.: US 7,757,742 B2
(45) Date of Patent: Jul. 20, 2010

(54) VIBRATION-INDUCED DIE DETACHMENT SYSTEM

(75) Inventors: Yiu Ming Cheung, Hong Kong (CN); Man Kit Chow, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 450 days.

(21) Appl. No.: 11/830,986

(22) Filed: Jul. 31, 2007

(65) Prior Publication Data

US 2009/0032186 A1 Feb. 5, 2009

(51) Int. Cl.
*B32B 38/10* (2006.01)
(52) U.S. Cl. .................. 156/584; 156/344; 438/464; 438/976
(58) Field of Classification Search .............. 156/344, 156/584; 438/464, 976
See application file for complete search history.

(56) References Cited

U.S. PATENT DOCUMENTS

| | | | |
|---|---|---|---|
| 6,201,306 B1 | 3/2001 | Kurosawa et al. | 257/783 |
| 7,015,071 B2 * | 3/2006 | Wada et al. | 438/120 |
| 7,240,422 B2 | 7/2007 | Cheung et al. | 29/762 |
| 2005/0059205 A1 * | 3/2005 | Maki et al. | 438/232 |
| 2006/0252233 A1 | 11/2006 | Honma et al. | 438/464 |

FOREIGN PATENT DOCUMENTS

| | | | |
|---|---|---|---|
| JP | 02230754 A | * | 9/1990 |
| JP | 05003242 A | * | 1/1993 |
| JP | 05109869 A | * | 4/1993 |

* cited by examiner

*Primary Examiner*—Mark A Osele
(74) *Attorney, Agent, or Firm*—Ostrolenk Faber LLP (57) ABSTRACT

A die is detachable from an adhesive tape on which the die is mounted with a die detachment tool comprising a vacuum enclosure that is operative to provide a vacuum suction on the adhesive tape. One or more ejector pins are housed in the vacuum enclosure and are projectable from the vacuum enclosure for lifting the die and adhesive tape. A vibrational tool is housed in the vacuum enclosure adjacent to the ejector pins and it is projectable from the vacuum enclosure to contact a portion of the adhesive tape at which the die is located. The vibrational tool is further operative to oscillate the adhesive tape and die for promoting delamination of the die from the adhesive tape.

17 Claims, 6 Drawing Sheets

VIBRATION-INDUCED DIE DETACHMENT SYSTEM

FIELD OF THE INVENTION

The present invention relates to a system for detaching a semiconductor die from an adhesive medium, and in particular, to a system for detaching a thin die from an adhesive tape on which it is mounted.

BACKGROUND AND PRIOR ART

In a typical die bonding process, semiconductor dice are detached and lifted from a film frame comprising plastic adhesive film or a Mylar film and are then transferred to a substrate such as a lead frame or printed wiring board (PWB) substrate. Typically, in a pick-up process, a designated die will first be aligned and moved to a location where push-up pins will rise to raise the die from below while the plastic adhesive film is held down by vacuum suction. The die will be detached from the plastic adhesive film when the push-up pins rise to an appropriate level. A collet or pick-up tool which is positioned just above the top surface of the die provides vacuum suction to pick up the detached die from the plastic adhesive film and transfers the die to a bonding substrate.

Conventionally, for small dice (for example, having less than 2 mm in width), one ejector pin positioned at the center of the die to be detached is used. However, for larger dice, multiple ejector pins are used in order to evenly distribute the push-up force on the die and reduce a pinching effect by the ejector pins. A prior art example of a die detachment apparatus disclosing the use of multiple round top push-up pins is U.S. Pat. No. 6,201,306 entitled "Push-up Pin of a Semiconductor Element Pushing-up Device, and a Method for Separating". Localized stress is generated by the push-up force of the pins and one way to reduce this stress is by using pins with different geometries such as round tops. Multiple round top push-up pins are operative to project upwards through a vacuum platform to detach a die from an adhesive tape.

When the dice get thinner, especially in the case of stacked dice in an electronic package, there is always a chance that a die may break or crack during the detachment process of the die from the plastic adhesive film. The breakage of the die is primarily due to the fact that the stress induced by the pushing up of the pins reaches the critical failure bending stress of the die before the delamination of the interface between the die and the plastic adhesive film takes place. This will be more problematic for (i) dice of bigger size, (ii) thinner dice, and (iii) attachments where there is a stronger adhesion force between the die and the plastic adhesive film.

Special techniques for detaching thin dice are exhibited in the prior art, such as employing projecting tools having lateral movement. U.S. Pat. No. 7,240,422 entitled "Apparatus and Method for Semiconductor Chip Detachment" shows an example of a prior art die detachment tool which discloses the use of laterally moving projecting tools for detaching thin dice. It includes a die detachment tool with projecting tools having curved top surfaces. The projecting tools are of predetermined width and project upwards from a vacuum platform to push and lift the die so as to detach it from an adhesive tape while the adhesive tape is pulled away from the die by vacuum suction provided at the platform. Using this technique, it is necessary for the projecting tools to move slower than the propagation speed of the delamination process so that delamination is complete. Therefore, the cycle time is longer as compared to using vertical push-up pins to detach dice.

Another prior art die detachment tool is disclosed in US Patent Publication No. US2006/0252233 entitled "Semiconductor Device and its Manufacturing Methods". The die detachment tool therein applies ultrasonic vibration to an upthrow pin for detaching thin dice from an adhesive tape. The heat and micro-vibration induced by the ultrasonic vibration enhance the delamination between the die and the adhesive tape. The drawback to this method relates to the use of an ultrasonic vibrator such as a transducer horn, which requires optimization in relation to the geometry of an upthrow pin and the type of adhesive tape used. Developing a customized application tool is necessary for different dice and adhesive tape combinations and this consumes a lot of time. In addition, the heat generated by the ultrasonic vibration needs to be controlled to prevent excessive deformation of the adhesive tape.

Therefore, it would be desirable to provide an apparatus and method for detaching thin dice from an adhesive tape while avoiding die cracking or deformation of the adhesive tape, and shortening cycle time.

SUMMARY OF THE INVENTION

It is thus an object of this invention to seek to provide a die detachment system for detaching thin dice from an adhesive tape on which the dice are mounted with reduced risk of cracking and deformation of the adhesive tape, while avoiding some of the disadvantages of the aforesaid prior art.

According to a first aspect of the invention, there is provided a die detachment tool for detaching a die from an adhesive tape on which the die is mounted, comprising: a vacuum enclosure that is operative to provide a vacuum force on the adhesive tape; one or more ejector pins housed in the vacuum enclosure which are projectable from the vacuum enclosure for lifting the adhesive tape; and a vibrational tool housed in the vacuum enclosure adjacent to the ejector pins and which is projectable from the vacuum enclosure to contact a portion of the adhesive tape at which the die is located, the vibrational tool being operative to oscillate the adhesive tape and die for promoting delamination of the die from the adhesive tape.

According to a second aspect of the invention, there is provided a method for detaching a die from an adhesive tape on which the die is mounted, comprising the steps of: providing a vacuum enclosure for generating vacuum force on the adhesive tape; projecting a vibrational tool from the vacuum enclosure to contact a portion of the adhesive tape at which the die is located, the vibrational tool being operative to oscillate the adhesive tape and die for promoting delamination of the die from the adhesive tape; projecting one or more ejector pins from the vacuum enclosure to lift the adhesive tape; and thereafter removing the die from the adhesive tape.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
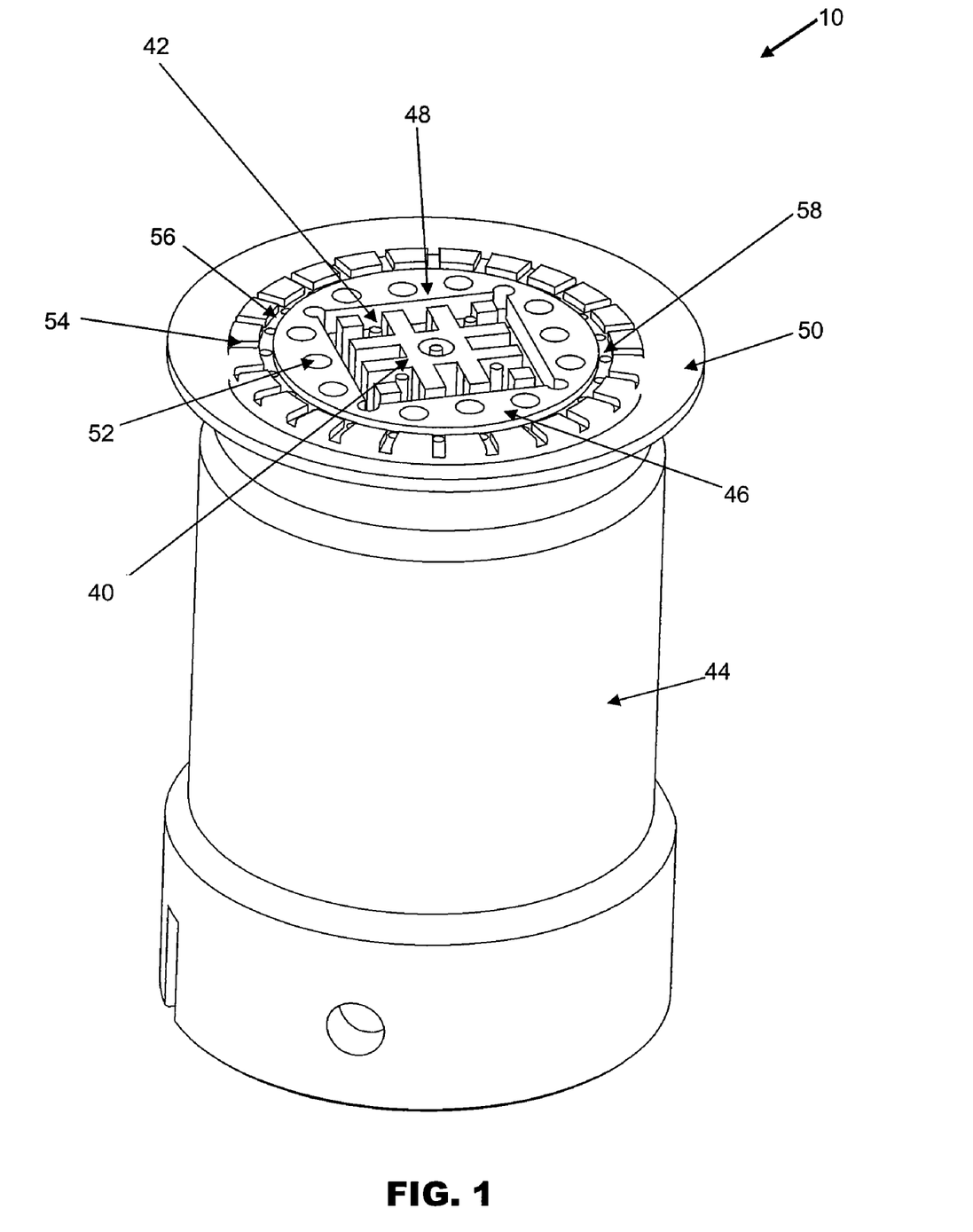
FIG. 1 is an isometric view of a die detachment tool according to the preferred embodiment of the present invention for detaching a thin die from an adhesive tape on which the die is mounted.

FIG. 1 is an isometric view of a die detachment tool according to the preferred embodiment of the present invention for detaching a thin die from an adhesive tape on which the die is mounted. The die detachment tool 10 comprises a vibrational tool 40 which may have a flat top surface, and ejector pins 42 which may have contact surfaces at their tips that are flat or rounded.

The ejector pins 42 and the vibrational tool 40 are located adjacent to one another and are both housed in a vacuum enclosure 44. They are projectable from the vacuum enclosure 44 to contact a portion of the adhesive tape at which the die is located to lift the die and adhesive tape. The surface of the vibrational tool 40 that contacts the adhesive tape may be in the shape of a grid. The vibrational tool 40 is operative to oscillate the adhesive tape and die for promoting delamination of the die from the adhesive tape.

The vacuum enclosure 44 is a cylindrical container with a substantially flat external vacuum platform 46 at its top. A quadrilateral vacuum opening 48 is centrally located on the vacuum platform 46 through which the ejector pins 42 and vibrational tool 40 are projectable. The quadrilateral vacuum opening 48 preferably has a square or a rectangular shape, which substantially conforms to a geometry of the die to be detached. The vacuum enclosure 44 is operative to provide vacuum suction on an adhesive tape through the vacuum opening 48. A vacuum seal of the interface between the vacuum platform 46 and the adhesive tape is provided by a sealing ring 50 on top of the vacuum enclosure 44 which surrounds a plurality of vacuum holes 52, vacuum slots 54 and vacuum grooves 56 on the vacuum platform 46, and peripheral vacuum holes 58 around the periphery of the vacuum platform 46. The die detachment tool 10 as described may be applied to a very thin die of 1-4 mils (25-100 microns) thickness by optimizing the process parameters and tool design.

The size of the vibrational tool 40 is preferably smaller than the size of the die placed on the vacuum platform 46. The outermost boundaries or edges of the vibrational tool 40 are designed in such a way that they are in close proximity with the edges of the die so that the outer edges of the vibrational tool 40 are preferably 0.3 mm to 1 mm from the edges of the die. There is no sharp pointed structure on the surface of the vibrational tool 40, ensuring that no localized stress is induced on the die when the vibrational tool 40 is vibrating vertically against the die.

The vibrational tool 40 includes gaps, such as holes and slots, having sizes of 1 mm or more bounded by its outer edges for locating the ejector pins 42 and allowing the projection of the ejector pins 42 through the gaps. These holes and slots allow the ejector pins 42 to project through the vibrational tool 40, and also allow vacuum suction to be applied to the adhesive tape lying on top of the vibrational tool 40. The vacuum suction will pull the adhesive tape away from the die when it is lifted by the vibrational tool 40 or by the ejector pins 42. The ejector pins 42 are positioned and evenly distributed within the outer edges of the vibrational tool 40 so that they can be projected from the vacuum enclosure 44 to support and lift the die when the die is ready to be picked up at the end of the process. Using this design, a very thin die with thickness of less than 2 mils may be detached from an adhesive film with adhesive strength up to 20 $J/m^2$.

Figure 2A:
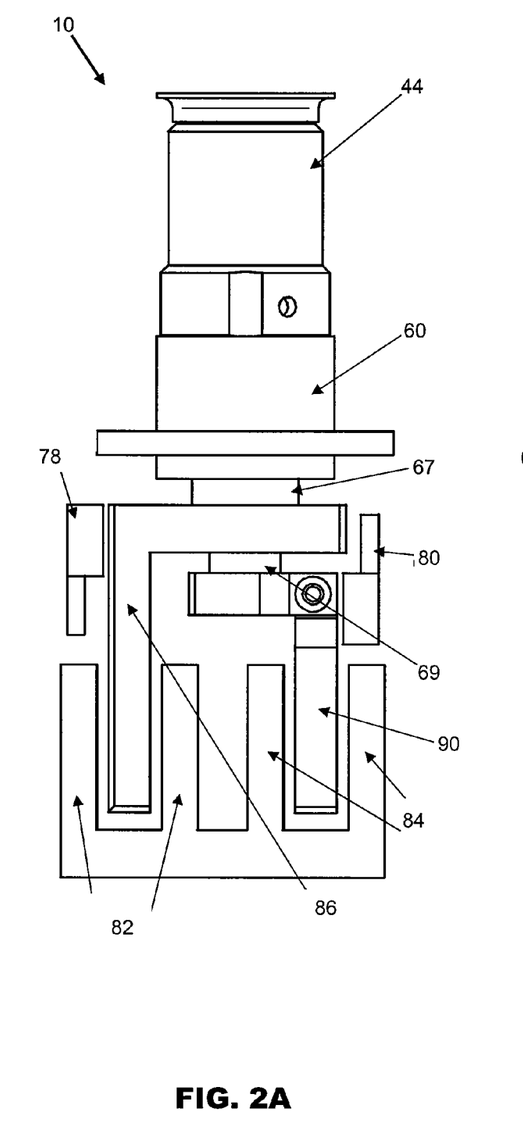
FIGS. 2A and 2B are side and sectional views respectively of the die detachment tool illustrated in FIG. 1.
Figure 2B:
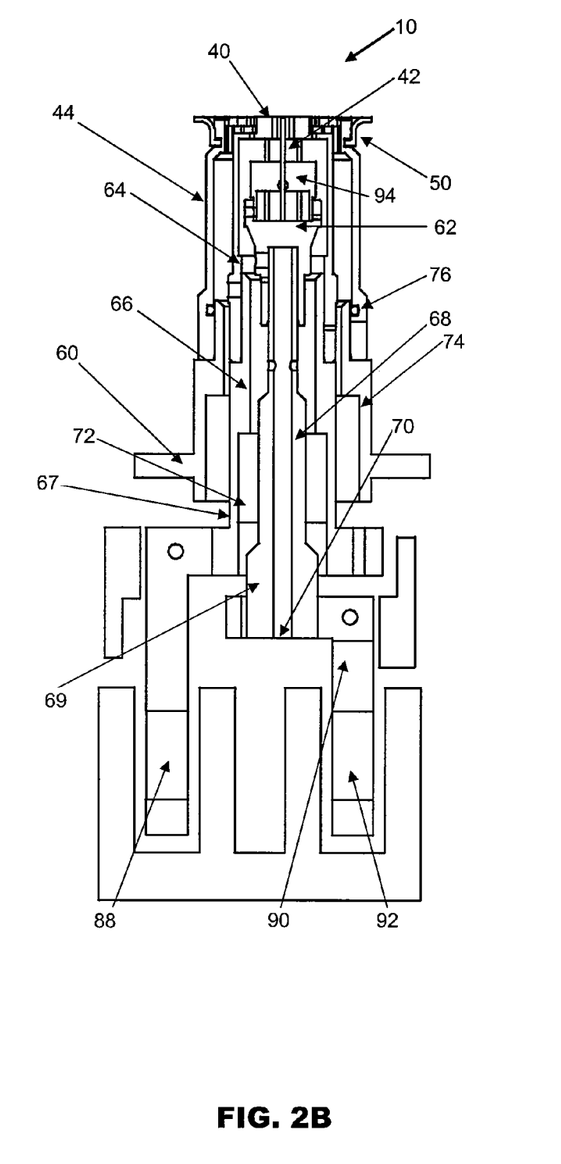

FIGS. 2A and 2B are side and sectional views respectively of the die detachment tool illustrated in FIG. 1. FIG. 2A illustrates the arrangement of some of the components of actuators which drive first and second stages, which may comprise an inner stage 68 and an outer stage 66. The outer stage 66 is for supporting the vibrational tool 40 and the inner stage 68 is for supporting the ejector pins 42. The outer and inner stages 66, 68 include linear encoders 78, 80 for the outer and inner motors, outer and inner actuator adaptors 67, 69, a pair of outer and inner motor magnets 82, 84 and outer and inner motor coil brackets 86, 90.

FIG. 2B shows the outer and inner stage assemblies of the die detachment tool 10 in detail. The outer stage assembly generally comprises the outer stage 66, the vibrational tool 40, a vibrational tool adapter 64 and the outer actuator adapter 67. The vibrational tool 40 resides on top of the vibrational tool adapter 64, which is further mounted on the outer stage 66. The outer stage 66 is connected to the outer actuator adapter 67. The outer stage assembly is operative to move freely inside the vacuum enclosure 44. An actuator comprising a linear motor, such as a servo-controlled linear voice-coil motor, is designated to drive the assembly so that the vibrational tool 40 is able to move up and down at a high speed to produce a vertical vibration required for inducing detachment of a die from an adhesive tape.

The inner stage assembly generally comprises the inner stage 68, the ejector pins 42 mounted on a pin chuck 94, a pin chuck adapter 62 and the inner actuator adapter 69. The ejector pins 42 are inserted in the pin chuck 94 which is supported on the pin chuck adapter 62. The pin chuck adapter 62 is mounted on the inner stage 68. The pin chuck adapter 62 is further inserted and locked on the post of the inner stage 68. The inner stage 68 is connected to the inner actuator adapter 69 which allows the inner stage assembly to move up and down freely inside the vacuum enclosure 44. When the vibrational tool 40 vibrates about the vacuum platform 46, the ejector pins 42 are kept stationary with their top surfaces level with the vacuum platform 46. A linear motor such as a voice-coil motor may drive this assembly to move the ejector pins 42 up and down. Alternatively, a pneumatic actuator may be used.

An outer linear guide 74 is located between a fixed non-movable base 60 and the outer actuator adapter 67. The outer linear guide 74 directs the linear motion of the outer stage as well as prevents the loss of vacuum from the vacuum enclosure 44. Similarly, an inner linear guide 72 is located between the outer actuator adapter 67 and inner actuator adapter 69, and directs the linear motion of the inner stage 68 preventing the loss of vacuum from the vacuum enclosure 44. An O-ring 76 located between the fixed non-movable base 60 and the base of the vacuum enclosure 44 serves to seal the vacuum enclosure 44 from the ambient atmosphere.

When vacuum suction is applied from the vacuum enclosure 44 to the top surface of the vacuum platform 46 via a vacuum inlet 70, a die 96 on an adhesive tape 98 placed on the vacuum platform 46 is sucked against the platform 46 and the surface of the vibrational tool 40. The die 96 on the adhesive tape 98 is movable together with the vibrational tool 40, which is configured to oscillate at an amplitude that extends above and below the external surface of the vacuum platform 46 of the vacuum enclosure 44.

The two vertically movable inner and outer stages 66, 68 are independently driven by the linear voice-coil motors. The outer stage 66 enables the vibrational tool 40 to execute fast vertical vibration to detach the die from the adhesive tape on the vacuum platform 46. The fast vertical vibration together with the vacuum suction on the vacuum platform 46 initiate the interfacial delamination between the die and the adhesive tape. In order to facilitate complete delamination, the motor should be capable of providing vertical vibration with a programmable motion stroke ranging above and below the surface of the vacuum platform 46, at a suitable vibrational frequency in a certain motion cycle time. There is also a programmable duration for the activation of the vertical vibration. Such requirements may be met by using a servo controlled linear voice-coil motor as an actuator for the vibrational tool 40.

The motor for the inner stage 68 serves only to move the ejector pins 42 up and down. Therefore, the motor may be either a servo controlled linear motor or a pneumatic linear actuator. The ejector pins 42 promote the delamination between the die 96 and the adhesive tape 98 after the vibrational tool 40 is deactivated. More particularly, the ejector pins 42 push up the die 96 from the adhesive tape 98 so that the die 96 may be readily picked up by a vacuum collet 99 at the end of the pick-up process.

The linear voice-coil motor for the outer stage 66 comprises an outer motor coil 88 residing in the outer motor coil bracket 86 which is positioned between the pair of outer motor magnets 82. The outer actuator adaptor 67 is connected to the outer motor bracket 86. The outer linear encoder 78 facilitates the servo control of the linear voice-coil motor.

In the case of the linear voice-coil motor for the inner stage 68, the motor comprises an inner motor coil 92 residing in the inner motor coil bracket 90 which is positioned between the pair of inner motor magnets 84. The linear encoder 80 facilitates the servo control of the linear voice-coil motor.

Figure 3:
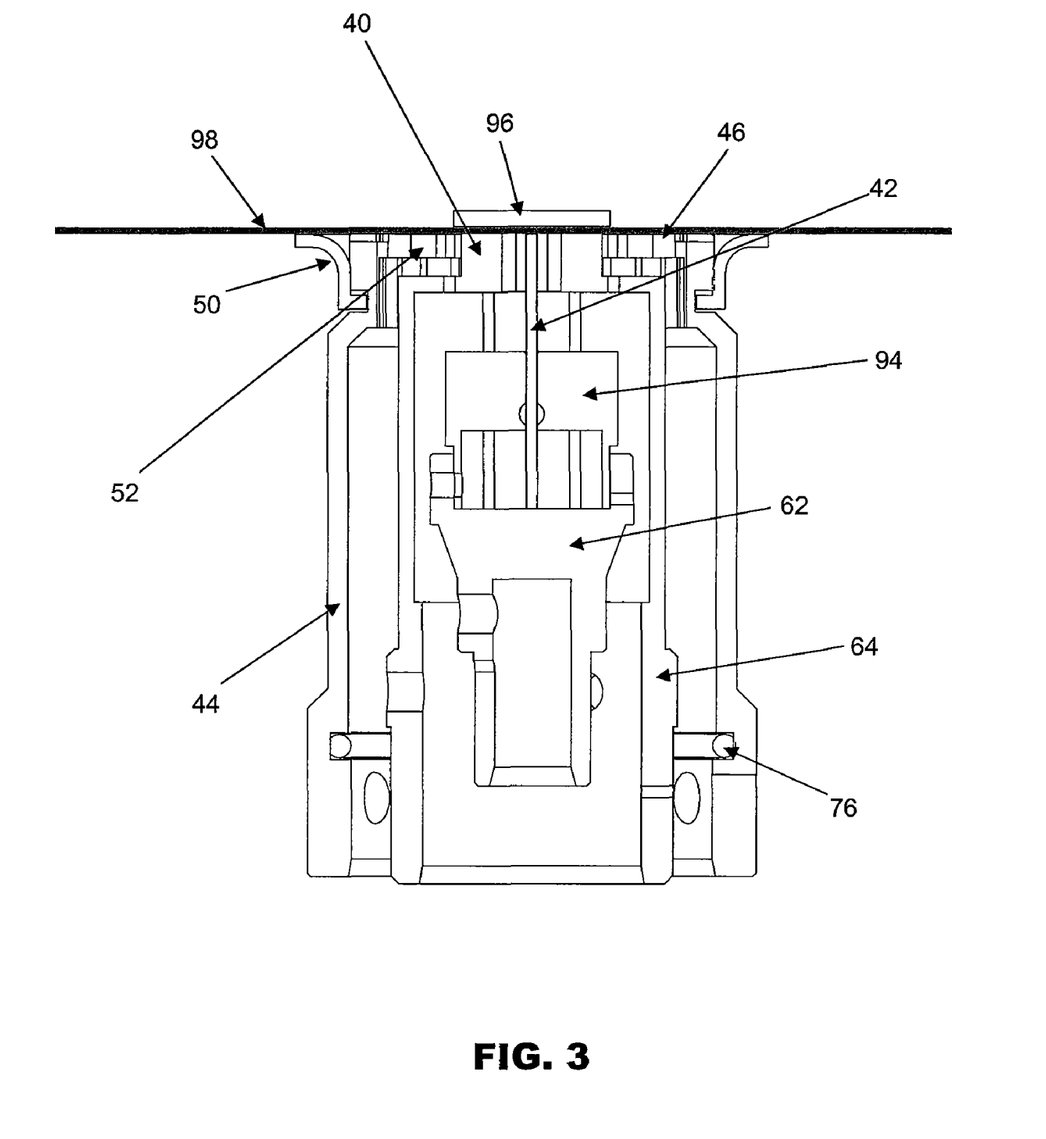
FIG. 3 is a sectional side view of the die detachment tool.

FIG. 3 is a sectional side view of the die detachment tool 10, and a die 96 attached to the adhesive tape 98 on the vacuum platform 46. To detach the die 96 from the adhesive tape 98, the die 96 is positioned at the center of the platform 46 over the positions of the vibrational tool 40 and the ejector pins 42 located inside the quadrilateral vacuum opening 48 of the platform 46.

The initial level of the top surface of the vibrational tool 40 and the tips of the ejector pins 42 are aligned with the external surface of the vacuum platform 46 so that the die 96 on the adhesive tape 98 lies flat on the vacuum platform 46. The top surface of the vibrational tool 40 on the outer stage 66 is flat and does not have any sharp and pointed structure, which prevents localized stress on the die 96 when the vibrational tool 40 pushes upwards against it. The slots and holes on the grid-like vibrational tool 40 allow the ejector pins 42 mounted on the inner stage 68 to pass through the slot and holes, as well as the vacuum suction to act on the adhesive tape 98. The size of the vibrational tool 40 is smaller than the die 96 and the outer edges of the vibrational tool 40 are arranged with distances of between 0.3 mm and 1 mm from corresponding edges of the die 96.

The height of the vacuum platform 46 is relatively fixed during the process of die detachment since the vacuum enclosure 44 is mounted on a fixed non-movable base 60. The vacuum sealing ring 50 on top of the vacuum enclosure 44 and the O-ring 76 at its bottom prevent loss of vacuum when vacuum suction is applied.

The size of the vacuum opening 48 on the vacuum platform 46 is larger than the die 96. Moreover, the four edges of the die 96 are preferably geometrically aligned with the four edges of the vacuum opening 48. More preferably, the vacuum opening 48 has a size that is about 1-2 mm larger than the size of the square or rectangular die 96. The apparatus 10 includes a gap of a 0.5 mm to 1 mm from an edge of the die 96 to an edge of the vacuum opening 48.

The level of the tips of the ejector pins 42 on the inner stage 68 and the level of the top surface of the vibrational tool 40 on the outer stage 66 are level with the surface of the vacuum platform 46 at this time. Therefore, no object protrudes above the vacuum platform 46. After the die 96 has been positioned, the vacuum suction of the vacuum enclosure 44 is turned on to create a vacuum inside the cavity of the vacuum enclosure 44. Vacuum is created when the adhesive tape 98 is sealed by the sealing ring 50, and the interface between the vacuum enclosure 44 and the fixed non-movable base 60 is sealed by the O-ring 76. The interface between the fixed non-movable base 60 and the outer actuator adaptor 67 is further sealed by the sealed outer linear guide 74 and the interface between the outer and inner actuator adaptors 67, 69 is sealed by the sealed inner linear guide 72.

The die 96 on the adhesive tape 98 is pulled downwards against the surface of the vacuum platform 46 and the top surface of the vibrational tool 40 by vacuum suction. As a result, the die 96 and the adhesive tape 98 are fixed in position and are not able to move laterally on top of the vacuum platform 46.

When the vacuum pressure inside the vacuum enclosure 44 reaches a certain pressure of about −80 kPa, the linear voice-coil motor becomes operative to actuate the outer stage 66 to produce vertical vibration acting on the die 96. The die 96 on the adhesive tape 98 oscillates vertically about the vacuum platform 46 at a programmable amplitude for a designated number of cycles and at a programmable frequency.

Figure 4A:
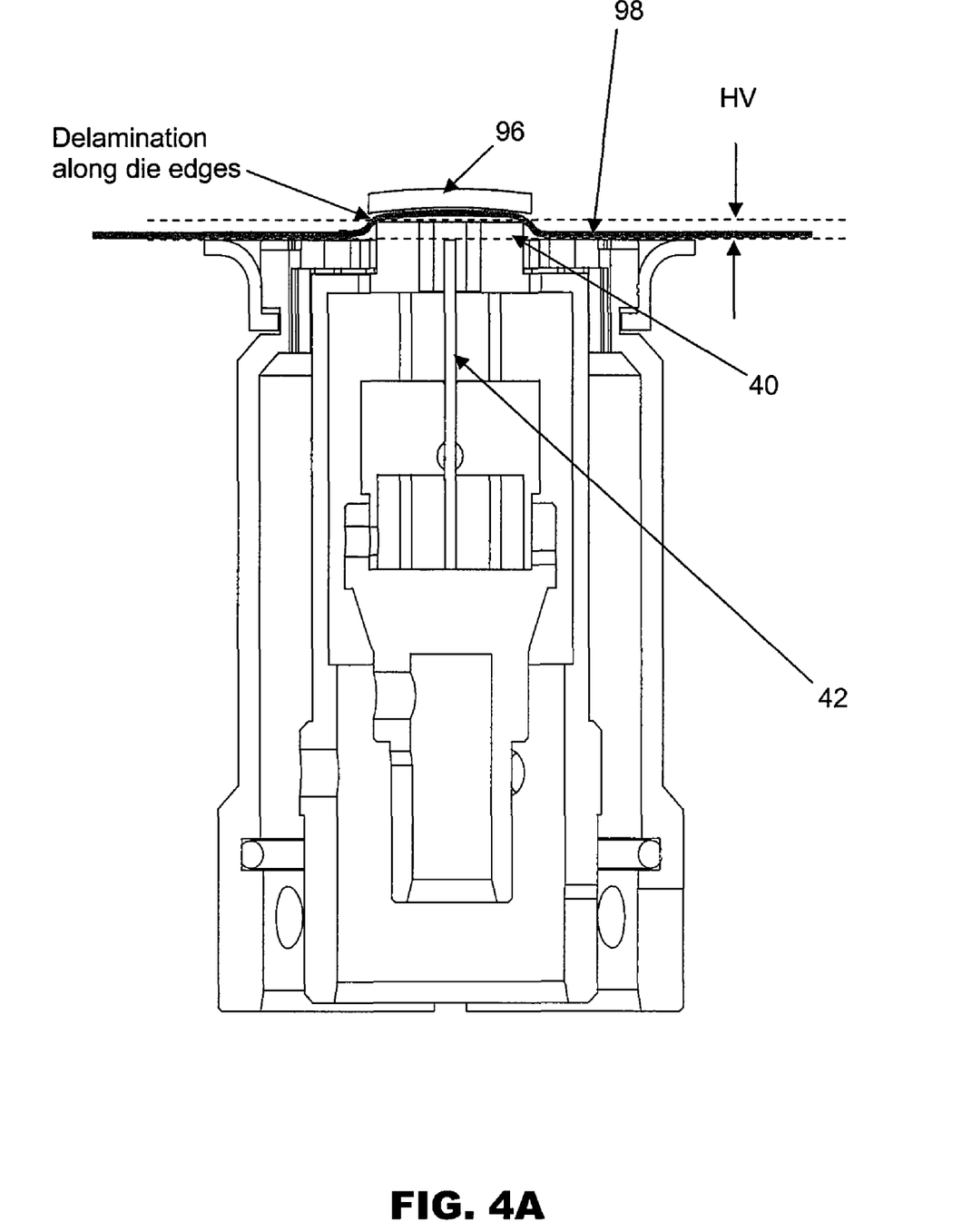
FIGS. 4A and 4B are sectional views of the die detachment tool showing the peak vibration amplitude of an oscillating vibrational tool.
Figure 4B:
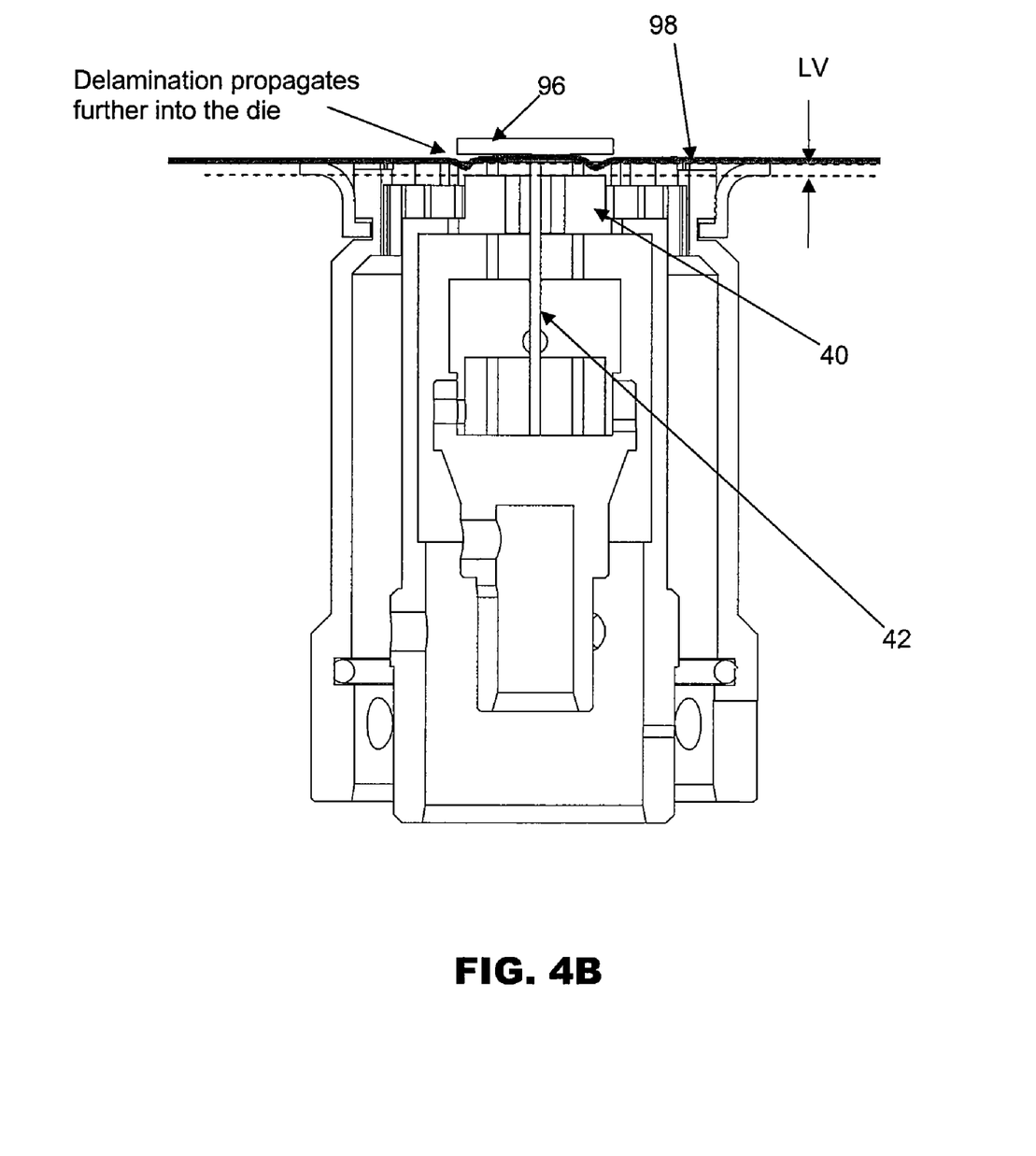

FIGS. 4A and 4B are sectional views of the die detachment tool showing the peak vibration amplitude of an oscillating vibrational tool 40. FIG. 4A shows that the vibrational tool 40 has moved up by a maximum height of HV above the vacuum platform 46 and FIG. 4B shows that the vibrational tool 40 has moved down by a maximum depth of LV below the vacuum platform 46.

The peak-to-peak vibration amplitude VA of the vibrational tool 40 is equal to the sum of HV and LV, that is, VA=HV+LV. The peak-to-peak vibration amplitude VA of the vibrational tool preferably ranges from 100 microns to 2 mm or more preferably +/−50 microns to +/−1 mm above and below the top surface of vacuum platform 46. The outer stage 66 is preferably driven to oscillate the vibrational tool 40 at a frequency that is not an ultrasonic frequency. Most preferably, the oscillation frequency of the vibrational tool 40 ranges from 10 Hz to 300 Hz and the tool vibrates for a duration ranging from 100 ms to 5 s in order to vibrationally induce delamination effectively. One exemplary setting for this vibrating vibrational tool 40 is a vibrational amplitude of +/−400 μm for approximately 400 ms vibration time at a frequency of 50 Hz.

When the vibrational tool 40 is vibrating above and below the flat surface of the vacuum platform 46, the ejector pins 42 which are evenly distributed inside the vibrational tool 40 are kept stationary with the height of the tips of the pins level with the top surface of the vacuum platform 46. This enhances the interfacial delamination between the die 96 and the adhesive tape 98. When the vibrational tool 40 moves above the surface of the vacuum platform 46, the adhesive tape 98 is stretched and the die 96 is lifted. The die 96 is further bent and pushed away from the adhesive tape 98 which is held down onto the surface of the vacuum platform 46 by vacuum suction. Bending moments of the die 96 during vibration create a peeling stress along the interface between the bottom surface of the die 96 and the upper surface of the adhesive tape 98. If the peeling stress is greater than the adhesive strength of this interface, interfacial delamination will occur. This delamination will occur along the four edges of the die 96. When the vibrational tool 40 moves down below the surface of the vacuum platform 46, the die 96 is supported by the stationary ejector pins 42. At the same time, vacuum suction pulls the adhesive tape 98 downwards and away from the die 96 as shown in FIG. 4B.

The interfacial delamination between the die 96 and the adhesive tape 98 then propagates further throughout the die 96. The vertical vibration of the vibrational tool 40 on the outer stage 66 facilitates a repetitive vertically oscillating motion acting on the die 96. For an appropriate vibrational rate, such as 50 Hz, and when the vibrational amplitude and time are large enough, the die 96 can be completely detached from the adhesive tape 98 as a result. At the end of the vibrational cycle, the vibrational tool 40 returns to the position where its top surface is level with the top surface of the vacuum platform 46.

Figure 5:
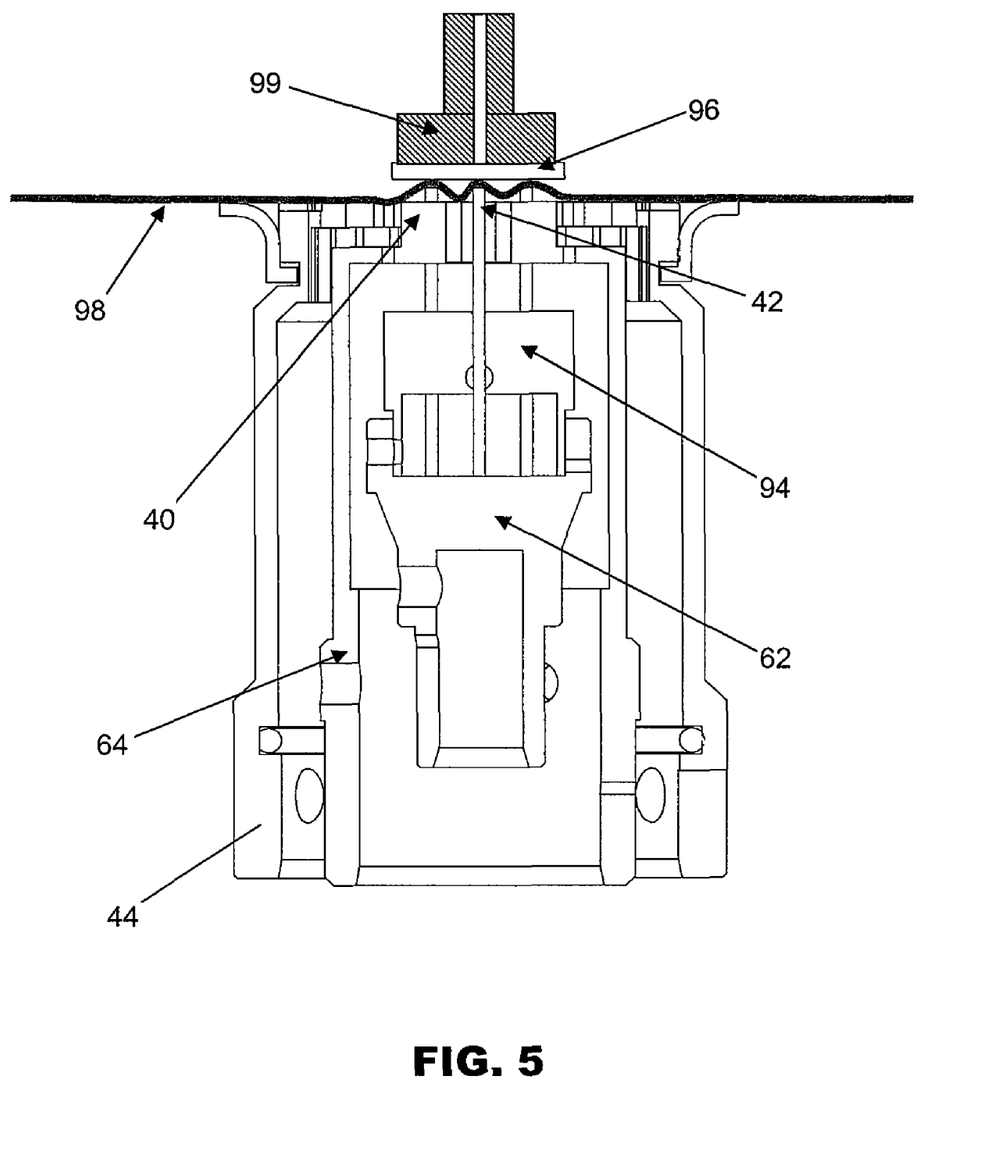
FIG. 5 is a sectional view of the die detachment tool showing the die substantially separated from the adhesive tape and ready to be picked up by a vacuum pick-up collet.

FIG. 5 is a sectional view of the die detachment tool showing the die 96 substantially separated from the adhesive tape 98 and ready to be picked up by a vacuum pick-up collet 99.

After the die 96 is completely detached from the adhesive tape 98 at the end of the vibrational cycle, the vacuum pick-up collet 99 rests on the detached die 96. The ejector pins 42 push the die 96 upwards to a pre-determined height above the surface of the vacuum platform 46. The vacuum pick-up collet 99 should move upwards with the ejector pins 42 to prevent excessive compressive load acting on the die 96. The vacuum pick-up collet 99 separates the die 96 from the adhesive tape 98 by moving further upwards while holding onto the die 96 by vacuum suction from the vacuum path within the collet 99.

After the die 96 is removed from the adhesive tape 98, the vacuum suction inside the vacuum enclosure 44 is turned off and the ejector pins 42 return to the height where the tips of the pins are level with the top surface of the vacuum platform 46.

The amplitude, frequency and time taken for the vertical oscillatory action of the vibrational tool 40 are preferably programmable to optimize the speed and performance of the detachment process for various sizes and thickness of the die 96 and adhesive strength of the adhesive tape 98. The amplitude of vertical vibration of the vibrational tool 40 is in the range from +/−50 μm to +/−1000 μm. The vibrational frequency of the vibrational tool 40 is in the range of 10 Hz to 300 Hz and the vibrational time is in the range of 100 ms to 5 seconds.

It should be appreciated that the apparatus and process of detaching a die from an adhesive tape using a vertical vibrational force in accordance with the preferred embodiment has several advantages over an apparatus and a process using ultrasonic vibration. The vibrational tool 40 according to the preferred embodiment is operated at a frequency in the range of 10 Hz to 300 Hz whereas ultrasonic excitation usually occurs at a frequency greater than 10 kHz, such as 20 kHz, 40 kHz and 60 kHz. A wide range of vibrational frequencies may be applied in the present invention to induce the delamination process since it is actuated by a servo controlled linear voice-coil motor. On the other hand, ultrasonic vibration requires specified ultrasonic frequencies since they are dictated by the ultrasonic generators that are used.

Another advantage is that the peak-to-peak vibrational amplitude for the present invention varies from 100 microns to 2 mm. In the case of a tool excited by an ultrasonic generator, the peak-to-peak vibrational amplitude is less than 50 microns and is therefore less effective in detaching the die 96 from the adhesive tape 98. Moreover, the vertical vibration which induces interfacial delamination between the die 96 and the adhesive tape 98 is achievable by mechanical means. Therefore, there is no increase in temperature in the vibrated region whereas using ultrasonic vibration to initiate the interfacial delamination brings about an increase in temperature as the ultrasonic energy is absorbed by the vibrating upthrow pin, the die and the adhesive tape.

The vibrational tool 40 of the present invention is designed according to the size of the die 96. It is, however, not necessary to optimize the geometry and payload of the vibrational tool 40 since it is actuated by a servo controlled linear voice-coil motor. Careful design and optimization for the geometry and payload of the application tool are required when an ultrasonic generator is used.

It should further be appreciated that the apparatus and process for detaching a die 96 from an adhesive tape 98 using vertical vibrational force in accordance with the preferred embodiment of the invention provides various other advantages. The invention does not require any sharp needles to push and detach the die 96 from the adhesive tape 98. This prevents localised stress on the die 96. Complete interfacial delamination between the die 96 and the adhesive tape 98 is accomplished by the vibrational tool 40 vibrating vertically under the die 96 and the adhesive tape 98 above and below the vacuum platform 46. The vertically vibrating action may also be carried out in parallel with the die attachment process of a die bonder, hence improving the efficiency of the die detachment and attachment processes.

The interfacial delamination between the die 96 and the adhesive tape 98 is also enhanced by the ejector pins 42 located within the outer edges of the grid-like vibrational tool 40 as the tool 40 vibrates vertically to delaminate the die 96 from the adhesive tape 98. The ejector pins 42 assist the delamination by remaining stationary with the tip of the pins at a height that is level with the surface of the vacuum platform 46 when the vibrational tool 40 retreats below the surface of the vacuum platform 46. When the vibrational tool 40 is withdrawn below the surface of the vacuum platform 46, the adhesive tape 98 retracted together with the vibrational tool 40 due to vacuum suction. At the same time, the adhesive tape 98 is pulled away from the die 96 since the die 96 is stopped and supported by the ejector pins 42 at the height which is level with the surface of the vacuum platform 46. The ejector pins 42 are also arranged in such a way that they are spread out evenly. This arrangement further allows the ejector pins 42 to support the die 96 when the vacuum collet 99 picks the die up to detach it from the adhesive tape.

The invention described herein is susceptible to variations, modifications and/or additions other than those specifically described and it is to be understood that the invention includes all such variations, modifications and/or additions which fall within the spirit and scope of the above description.

The invention claimed is:

1. A die detachment tool for detaching a die from an adhesive tape on which the die is mounted, comprising:

a vacuum enclosure that is operative to provide a vacuum suction on the adhesive tape;

one or more ejector pins housed in the vacuum enclosure which are projectable from the vacuum enclosure for lifting the die and adhesive tape; and a vibrational tool housed in the vacuum enclosure adjacent to the ejector pins and which is projectable from the vacuum enclosure to contact a portion of the adhesive tape at which the die is located, the vibrational tool being operative to oscillate the adhesive tape and die for promoting delamination of the die from the adhesive tape.

2. The die detachment tool as claimed in claim 1, wherein a surface of the vibrational tool that is configured to contact the adhesive tape is in the shape of a grid.

3. The die detachment tool as claimed in claim 2, wherein the ejector pins are located within outer edges of the vibrational tool.

4. The die detachment tool as claimed in claim 3, wherein the vibrational tool includes gaps having sizes of 1 mm or more bounded by its outer edges for locating the ejector pins and allowing for projection of the ejector pins through the gaps.

5. The die detachment tool as claimed in claim 1, wherein the ejector pins have contact surfaces at their tips that are flat or rounded.

6. The die detachment tool as claimed in claim 1, further comprising a flat external platform surface on the vacuum enclosure and a vacuum opening on the platform surface through which the ejector pins and vibrational tool are projectable.

7. The die detachment tool as claimed in claim 6, wherein the vacuum opening has a square or rectangular shape which conforms to a geometry of the die to be detached.

8. The die detachment tool as claimed in claim 7, including a gap of 0.5 mm to 1 mm from an edge of the die to an edge of the vacuum opening.

9. The die detachment tool as claimed in claim 1, wherein the vibrational tool is configured to oscillate at an amplitude that extends above and below an external surface of the vacuum enclosure.

10. The die detachment tool as claimed in claim 1, wherein outer edges of the vibrational tool are arranged with distances of between 0.3 mm and 1 mm from corresponding edges of the die.

11. The die detachment tool as claimed in claim 1, further comprising a first stage for supporting the ejector pins and a second stage for supporting the vibrational tool.

12. The die detachment tool as claimed in claim 11, further comprising an actuator comprising a linear servo motor or pneumatic motor for driving the first stage.

13. The die detachment tool as claimed in claim 11, further comprising an actuator comprising a linear servo motor for driving the second stage to oscillate the vibrational tool.

14. The die detachment tool as claimed in claim 13, wherein the linear servo motor is a servo-controlled linear voice-coil motor.

15. The die detachment tool as claimed in claim 1, wherein the vibrational tool is operative to oscillate at a frequency that is not an ultrasonic frequency.

16. The die detachment tool as claimed in claim 15, wherein the oscillation frequency of the vibrational tool is 10 Hz to 300 Hz.

17. The die detachment tool as claimed in claim 1, wherein the amplitude, frequency and time taken for the oscillatory action of the vibrational tool are programmable.

* * * * *